US009401307B2

(12) United States Patent
Tanaka et al.

(10) Patent No.: US 9,401,307 B2
(45) Date of Patent: Jul. 26, 2016

(54) METHOD FORMING THROUGH-VIA USING ELECTROLESS PLATING SOLUTION

(71) Applicant: Mitsubishi Gas Chemical Company, Inc., Chiyoda-ku (JP)

(72) Inventors: Keiichi Tanaka, Tokyo (JP); Priangga Perdana Putra, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 14/627,545

(22) Filed: Feb. 20, 2015

(65) Prior Publication Data

US 2015/0243553 A1 Aug. 27, 2015

(30) Foreign Application Priority Data

Feb. 21, 2014 (JP) ................................ 2014-031241

(51) Int. Cl.

*H01L 21/768* (2006.01)
*H01L 23/532* (2006.01)
*H01L 23/48* (2006.01)
*H01L 25/065* (2006.01)

(52) U.S. Cl.

CPC .... *H01L 21/76846* (2013.01); *H01L 21/76867* (2013.01); *H01L 21/76874* (2013.01); *H01L 23/481* (2013.01); *H01L 23/53238* (2013.01); *H01L 25/0655* (2013.01); *H01L 2221/1084* (2013.01)

(58) Field of Classification Search

None

See application file for complete search history.

(56) References Cited

U.S. PATENT DOCUMENTS

2007/0166991 A1* 7/2007 Sinha ................ H01L 21/76898 438/597
2014/0087560 A1 3/2014 Mevellec et al.

FOREIGN PATENT DOCUMENTS

| | | |
|---|---|---|
| JP | 2003-203914 | 7/2003 |
| JP | 2010-185113 | 8/2010 |
| JP | 2013-251344 | 12/2013 |
| JP | 2014-513213 | 5/2014 |
| WO | WO 2012/150133 A2 | 11/2012 |

* cited by examiner

*Primary Examiner* — Charles Garber
*Assistant Examiner* — Stanetta Isaac
(74) *Attorney, Agent, or Firm* — Oblon, McClelland, Maier & Neustadt, L.L.P.

(57) ABSTRACT

The present invention provides a method for forming a through-via, including the steps of (1) forming an alloy film as a diffusion-preventive layer that prevents diffusion of copper, in an area on a side wall of a hole formed in a substrate that extends from an entrance of the hole to a central part of the hole, by use of an electroless cobalt plating solution or an electroless nickel plating solution containing at least cobalt ion or nickel ion, a complexing agent, a reductant, and a pH adjusting agent; (2) forming an alloy film as a diffusion-preventive layer in an area on the side wall of the hole formed in the substrate that extends from the central part of the hole to a bottom of the hole, by use of an electroless cobalt plating solution or an electroless nickel plating solution containing at least the cobalt ion or the nickel ion, the complexing agent, the reductant, the pH adjusting agent, and an amino group-containing polymer; and (3) stacking a copper seed layer on the diffusion-preventive layer formed in each of steps (1) and (2) by use of an electroless copper plating solution.

11 Claims, 2 Drawing Sheets

Stacking

Si
Via formation

Insulator / Barrier / Seed deposition

Via filling

Surface metal removal

Wafer thinng

Stacking

METHOD FORMING THROUGH-VIA USING ELECTROLESS PLATING SOLUTION

TECHNICAL FIELD

The present invention relates to a method for forming a through-via running through a silicon substrate, and specifically, to a method by which a diffusion-preventive layer that prevents diffusion of copper is formed on a side wall of a hole formed in the substrate by an electroless plating method, and a copper seed layer is stacked on the diffusion-preventive layer.

BACKGROUND ART

A through-silicon via (TSV) is one mounting technology for a semiconductor device, which is an electronic component, and refers to an electrode vertically running through a semiconductor chip formed of silicon.

In order to address issues of reducing the mounting space, improving the processing speed, reducing the power consumption and the like, methods for forming a through-via running through a substrate formed of silicon, glass, a ceramic material or the like and stacking a semiconductor chip thereon have been proposed. Among these methods, methods for forming silicon-through vias (TSVs) using silicon for a substrate are now being actively studied. A TSV is formed by making a through-hole in a silicon substrate, then forming an insulating layer of a silicon oxide film, a polyimide film or the like on a side wall of the through-hole, and filling the through-hole with copper, which is a conductor.

FIGS. 1A-1F show an example of steps for forming TSVs. First, vias are formed by DRIE in a wafer having a wire layer formed thereon (FIG. 1A), and an insulating oxide film, a barrier metal layer, and a conductive seed layer are formed (FIG. 1B). Then, the vias are filled with copper by electric plating (FIG. 1C). An excessive part of copper that is deposited on a top surface of the wafer is removed by CMP, and the top surface is flattened (FIG. 1D). Then, a rear surface of the wafer is polished to decrease the thickness of the wafer. Thus, TSVs running down to the rear surface of the wafer are formed (FIG. 1E). Such wafers are stacked with a joining layer formed of solder or the like being sandwiched between each two adjacent wafers, and thus one package is formed (FIG. 1F).

Filling of the vias with copper, which is a conductor, is usually performed by copper plating. Therefore, in order to form a copper seed layer used to start electric copper plating and also in order to prevent copper from being diffused into silicon, a diffusion-preventive layer formed of an alloy of tantalum (Ta), titanium (Ti) or the like needs to be provided between the insulating layer and the copper seed layer. The diffusion-preventive layer, which is usually formed by physical vapor deposition (PVD) or chemical vapor deposition (CVD), has a problem that the metal is easily deposited in a top part of the through-hole and thus the step coverage of the film (ratio of the film thickness in a bottom of the through-hole with respect to the film thickness in the top part of the through-hole) is low. A sufficient step coverage is considered to be needed.

As a method replacing PVD or CVD, a technique of forming a diffusion-preventive layer and a copper seed layer on the side wall of the through-hole by an electroless plating method has been proposed (Patent Document 1). However, the electroless plating does not solve the problem that the metal is easily deposited in the top part of the through-hole, and the step coverage still needs to be improved.

In order to uniformize the film thickness on the side wall of the through-hole and thus to improve the step coverage, a bottom-up agent is commonly used. In Patent Document 2, a sulfur-based organic compound such as bis-(3-sulfopropyl) disulfide or the like is used as a bottom-up agent. Patent Document 3 proposes a method of adding polyethyleneimine to an electroless nickel plating solution.

Patent Document 4 describes that a diffusion-preventive layer having a uniform thickness can be formed on a side wall of a through-hole by performing electroless plating while the amount of the sulfur-based bottom-up agent is adjusted. However, in a step next to the formation of the diffusion-preventive layer performed by use of the sulfur-based bottom-up agent, namely, in the step of forming a copper seed layer, the electroless deposition of copper on the diffusion-preventive layer is suppressed, and an alloy of cobalt or nickel, which is a less noble metal than copper, is oxidized by copper and thus dissolved. This causes a stacking flaw between the diffusion-preventive layer and the copper seed layer. Therefore, a technique for stacking the copper seed layer without causing the diffusion-preventive layer to be extinct is now been strongly desired.

PRIOR ART DOCUMENTS

Patent Documents

Patent Document 1: Japanese Laid-Open Patent Publication No. 2003-203914

Patent Document 2: Japanese Laid-Open Patent Publication No. 2010-185113

Patent Document 3: Japanese PCT National-Phase Publication No. 2014-513213

Patent Document 4: Japanese Laid-Open Patent Publication No. 2013-251344

SUMMARY OF THE INVENTION

Problems to be Solved by the Invention

The present invention has an object of solving at least one of the above-described problems of the conventional art. The present invention also has an object of providing a method for forming a through-via having a sufficient step coverage by stacking a diffusion-preventive layer having a uniform thickness and a copper seed layer on a side wall of a hole formed in a substrate.

Means for Solving the Problems

In order to solve the above-described problems, the present inventors made studies on the types of additives usable for forming a diffusion-preventive layer, the composition ratio of the electroless plating solution, and the procedure of film formation, and as a result, found that an alloy film (diffusion-preventive layer) having a uniform thickness can be deposited on a side wall of a hole with high reproducibility by the present invention, which will be described below.

The present invention is as follows.

<1> A method for forming a through-via, comprising the steps of:

(1) forming an alloy film as a diffusion-preventive layer that prevents diffusion of copper, in an area on a side wall of a hole formed in a substrate that extends from an entrance of the hole to a central part of the hole, by use of an electroless cobalt plating solution or an electroless nickel plating solution containing at least cobalt ion or nickel ion, a complexing agent, a reductant, and a pH adjusting agent;

(2) forming an alloy film as a diffusion-preventive layer in an area on the side wall of the hole formed in the substrate that extends from the central part of the hole to a bottom of the hole, by use of an electroless cobalt plating solution or an electroless nickel plating solution containing at least the cobalt ion or the nickel ion, the complexing agent, the reductant, the pH adjusting agent, and an amino group-containing polymer; and (3) stacking a copper seed layer on the diffusion-preventive layer, formed in each of steps (1) and (2), by use of an electroless copper plating solution.

<2> The method for forming a through-via according to <1> above, wherein the amino group-containing polymer is contained in an amount of 0.0001% by mass to 0.02% by mass with respect to a total amount of the plating solution.

<3> The method for forming a through-via according to <1> or <2> above, wherein the amino group-containing polymer is an allylamine polymer, a diallylamine polymer, or a copolymer containing allylamine or diallylamine.

<4> The method for forming a through-via according to any one of <1> to <3> above, wherein the plating solution used in each of steps (1) and (2) contains tungsten and/or molybdenum.

<5> The method for forming a through-via according to any one of <1> to <4> above, wherein a ratio of a thickness (S) of the alloy film at the bottom of the hole with respect to a thickness (C) of the alloy film at the entrance of the hole (step coverage: (S/C)×100%) is 30 to 300%.

Advantageous Effect of the Invention

By use of an electroless plating solution and a method for forming a through-via according to the present invention, a diffusion-preventive layer having a uniform thickness and a copper seed layer can be stacked on a side wall of a hole that is formed in a substrate.

EMBODIMENTS FOR CARRYING OUT THE INVENTION

Figures 1A, 1B, 1C, 1D, 1E, 1F:
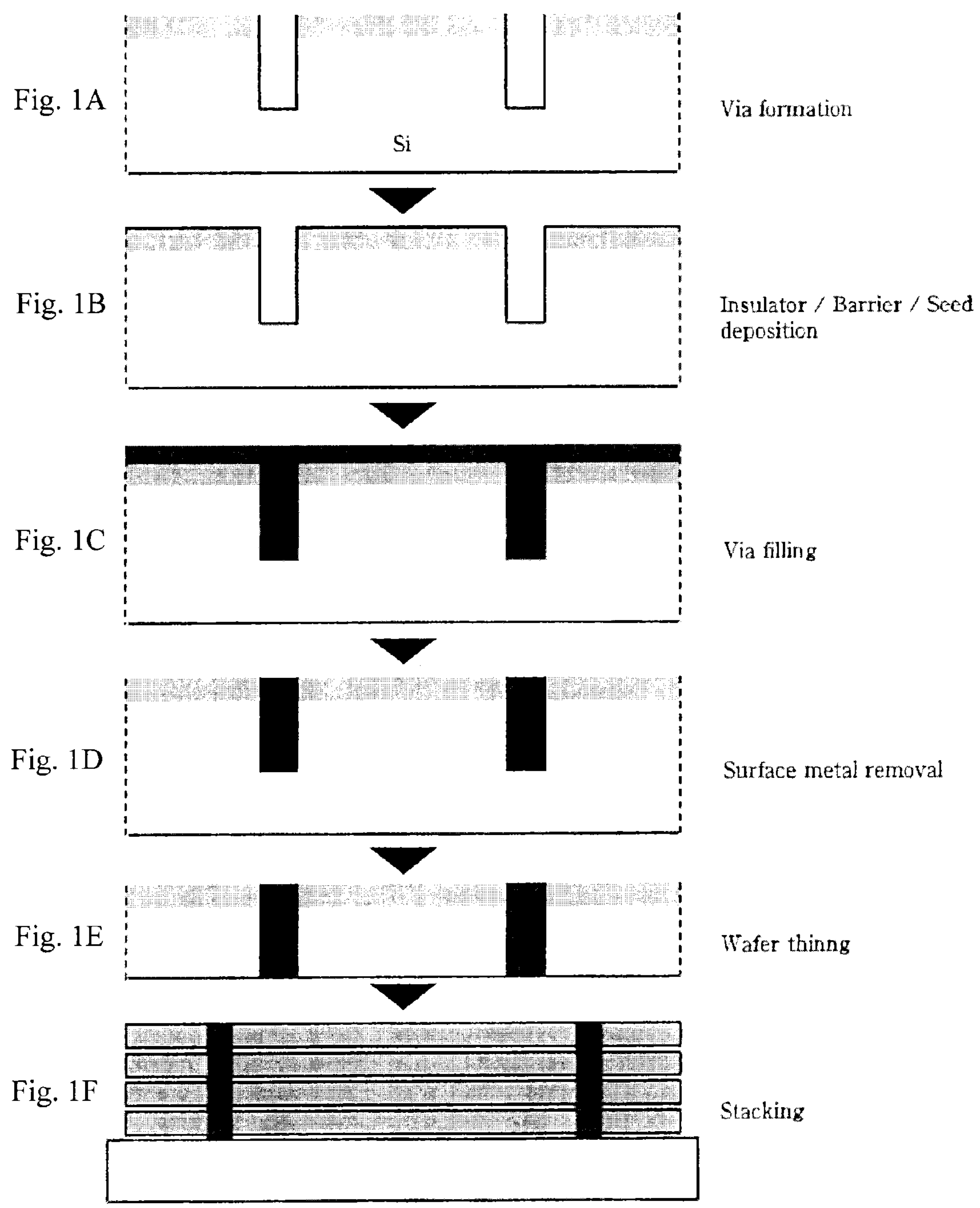
FIGS. 1A-1F provide schematic views showing an example of steps for forming TSVs according to a conventional technology.

Hereinafter, the present invention will be described.

An electroless plating solution usable for forming a diffusion-preventive layer according to the present invention is an aqueous solution containing a metal salt, a complexing agent, a reductant and a pH adjusting agent. These components are mixed at an optional ratio for use. The metal salt may be, for example, a cobalt compound or a nickel compound, and may contain tungsten and/or molybdenum in order to make the metal salt an alloy and thus to form an alloy film. The complexing agent complexes metal ion to improve the stability thereof in the electroless plating solution so that the metal ion is not precipitated as a hydroxide. The reductant reduces the metal ion, and the pH adjusting agent adjusts the pH value of the plating solution.

The cobalt compound as a supply source of cobalt ion usable in the present invention may be a water-soluble cobalt salt. Preferable examples of the water-soluble cobalt salt include cobalt sulfate, cobalt chloride, cobalt acetate, cobalt nitrate, and the like. Usable water-soluble cobalt salts are not limited to these, and include all the compounds that release the cobalt ion.

The concentration of the cobalt ion in the electroless plating solution is preferably 0.005 to 0.5 mol/L, more preferably 0.01 to 0.4 mol/L, and especially preferably 0.02 to 0.3 mol/L. The concentration is not limited to such a range, and may be of an optional value.

The nickel compound as a supply source of nickel ion usable in the present invention may be a water-soluble nickel salt. Preferable examples of the water-soluble nickel salt include nickel sulfate, nickel chloride, nickel acetate, nickel nitrate, and the like. Usable water-soluble nickel salts are not limited to these, and include all the compounds that release nickel ion.

The concentration of the nickel ion in the electroless plating solution is preferably 0.005 to 0.5 mol/L, more preferably 0.01 to 0.4 mol/L, and especially preferably 0.02 to 0.3 mol/L. The concentration is not limited to such a range, and may be of an optional value.

Examples of a tungsten compound as a supply source of tungstate ion preferably usable in the present invention include tungstate, sodium tungstate, and ammonium tungstate. Usable tungsten compounds are not limited to these, and include all the compounds that release the tungstate ion.

The concentration of the tungstate ion in the electroless plating solution is preferably 0.005 to 0.5 mol/L, more preferably 0.01 to 0.4 mol/L, and especially preferably 0.05 to 0.3 mol/L. The concentration is not limited to such a range, and may be of an optional value.

Examples of a molybdenum compound as a supply source of molybdate ion preferably usable in the present invention include molybdate, sodium molybdate, and ammonium molybdate. Usable molybdenum compounds are not limited to these, and include all the compounds that release the molybdate ion.

The concentration of the molybdate ion in the electroless plating solution is preferably 0.005 to 0.5 mol/L, more preferably 0.01 to 0.4 mol/L, and especially preferably 0.05 to 0.3 mol/L. The concentration is not limited to such a range, and may be of an optional value.

The complexing agent usable in the present invention may be a material that forms a complex together with the cobalt ion or the nickel ion. The complexing agent is not limited to any specific material. Materials preferably usable as the complexing agent include, for example, hydroxycarboxylic acids such as citric acid, tartaric acid, gluconic acid, malic acid, and the like.

The concentration of the complexing agent in the electroless plating solution needs to be at least an equivalent concentration to, and is preferably at least twice the equivalent concentration to, the concentration of the cobalt ion or the nickel ion. Specifically, the concentration of the complexing agent is preferably 0.01 to 1 mol/L, more preferably 0.05 to 0.8 mol/L, and especially preferably 0.01 to 0.6 mol/L. When the concentration of the complexing agent is 0.01 to 1 mol/L, the plating operation can be performed stably.

Materials preferably usable as the reductant in the present invention include, for example, hypophosphorous acid, alkylboranes, and the like. Alkylboranes include, for example, monoalkylamineborane, dialkylamineborane, trialkylamineborane, and the like.

The concentration of the reductant in the electroless plating solution is preferably 0.001 to 0.6 mol/L, more preferably 0.005 to 0.5 mol/L, and especially preferably 0.01 to 0.4 mol/L. When the concentration of the reductant is 0.001 to 0.6 mol/L, the plating film can be formed stably.

The pH adjusting agent usable in the present invention may be an alkaline compound. Usable alkaline compounds include, for example, potassium hydroxide, sodium hydroxide, tetramethylammonium hydroxide (TMAH), and the like.

The pH value of the electroless plating solution is preferably to 7 to 13, more preferably 7.5 to 12, and especially preferably 8 to 11. When the pH value is 7 to 13, the plating film can be formed stably.

The electroless plating solution usable in the present invention may further contain a surfactant formed of alkylsulfate, alkylphosphate, alkylsulfonate or the like, or a water-soluble polymer such as polyethyleneglycol or the like.

These additives act as a leveler that improves the smoothness of the plating film. The concentration of the surfactant or the water-soluble polymer in the electroless plating solution is preferably 1 ppm to 5000 ppm.

An amino group-containing polymer that may be added to the electroless cobalt plating solution or the electroless nickel plating solution usable in the present invention is preferably an allylamine polymer, a diallylamine polymer, or a copolymer containing allylamine or diallylamine. These polymers may be used independently or as a mixture of two or more. As each of these polymers, a commercially available product may be used. For example, polyallylamine (PAA series) or polyamine (PAS series) produced by Nittobo Medical Co., Ltd., is preferably usable.

There is no specific limitation on the average molecular weight of the amino group-containing polymer. The average molecular weight is preferably 300 to 200000, and more preferably 500 to 100000.

The concentration of the amino group-containing polymer in the electroless plating solution is preferably 0.0001 to 0.02% by mass, more preferably 0.0002 to 0.01% by mass, and especially preferably 0.0003 to 0.005% by mass. When the concentration of the amino group-containing polymer is lower than 0.0001% by mass, the effect of suppressing the film growth in a top part of a hole is not provided, and thus a film having a uniform thickness cannot be formed. When the concentration of the amino group-containing polymer exceeds 0.02% by mass, there occurs a flaw that the bottom-up effect is deteriorated and also a problem that the solubility of the polymer in the plating solution is decreased.

The electroless copper plating solution usable in the present invention for forming a copper seed layer is an aqueous solution containing a copper salt, a complexing agent, a reductant and a pH adjusting agent. These components are mixed at an optional ratio for use. The copper salt is a copper compound and supplies copper ion. The complexing agent complexes the copper ion to improve the stability thereof in the electroless copper plating solution so that the copper ion is not precipitated as a hydroxide. The reductant reduces the copper ion, and the pH adjusting agent adjusts the pH value of the plating solution.

The copper compound as a supply source of the copper ion usable in the present invention may be a water-soluble copper salt. Preferable examples of the water-soluble copper salt include copper sulfate, copper chloride, copper acetate, copper nitrate, and the like. Usable water-soluble copper salts are not limited to these, and include all the compounds that release the copper ion.

The concentration of the copper ion in the electroless plating solution is preferably 0.001 to 0.5 mol/L, more preferably 0.005 to 0.4 mol/L, and especially preferably 0.01 to 0.3 mol/L. The concentration is not limited to such a range, and may be of an optional value.

The complexing agent usable in the present invention may be a material that forms a complex together with the copper ion. The complexing agent is not limited to any specific material. Materials preferably usable as the complexing agent include, for example, ethylenediaminetetraacetic acid compounds such as ethylenediaminetetraacetic acid, ethylenediaminetetraacetic acid sodium salt, and the like; and hydroxycarboxylic acids such as citric acid, tartaric acid and the like.

The concentration of the complexing agent in the electroless plating solution needs to be at least an equivalent concentration to, and is preferably at least 1.5 times the equivalent concentration to, the concentration of the copper ion. Specifically, the concentration of the complexing agent is preferably 0.0015 to 1 mol/L, more preferably 0.0075 to 0.8 mol/L, and especially preferably 0.015 to 0.6 mol/L. When the concentration of the complexing agent is 0.0015 to 1 mol/L, the plating operation can be performed stably.

Materials preferably usable as the reductant in the present invention include, for example, formaldehyde, glyoxylic acid, hypophosphorous acid, alkylboranes, and the like. Alkylboranes include, for example monoalkylamineborane, dialkylamineborane, trialkylamineborane, and the like.

The concentration of the reductant in the electroless plating solution is preferably 0.001 to 0.8 mol/L, more preferably 0.005 to 0.7 mol/L, and especially preferably 0.01 to 0.6 mol/L. When the concentration of the reductant is 0.001 to 0.8 mol/L, the plating film can be formed stably.

The pH adjusting agent usable in the present invention may be an alkaline compound. Usable alkaline compounds include, for example, potassium hydroxide, sodium hydroxide, tetramethylammonium hydroxide (TMAH), and the like.

The pH value of the electroless plating solution is preferably to 9 to 14, more preferably 10 to 13.5, and especially preferably 10.5 to 13. When the pH value is 9 to 14, the plating film can be formed stably.

The electroless copper plating solution usable in the present invention may further contain a surfactant formed of alkylsulfate, alkylphosphate, alkylsulfonate or the like, a water-soluble polymer such as polyethyleneglycol or the like, 2,2'-bipyridyl, phenanthroline, or the like.

These additives act as a leveler that improves the smoothness of the plating film. The concentration of the surfactant or the water-soluble polymer in the electroless copper plating solution is preferably 1 ppm to 5000 ppm.

According to the present invention, any plating technique that puts the plating solution into contact with a part to be plated is usable with no specific limitation. Either a batch system of plating a plurality of wafers at the same time, or a single-wafer system of plating the wafers one by one, may be used.

The temperature for the electroless plating is preferably 40° C. to 90° C., more preferably 45° C. to 80° C., and especially preferably 50° C. to 70° C.

In the method according to the present invention, the step coverage, which is the ratio of the thickness of the alloy film (diffusion-preventive layer) in a bottom of the hole with respect to the thickness of the alloy film (diffusion-preventive layer) in the top part of the hole, namely, (S/C)×100%, is preferably 30% to 300%, more preferably 40% to 250%, and especially preferably 50% to 200%.

The thickness of the alloy film may be found as follows. A substrate for evaluation, namely, a substrate having the alloy film formed thereon, is cut in a direction perpendicular to the hole, the cross-section of the alloy film is observed by use of a scanning electron microscope (SEM), and the thickness of the film is measured.

EXAMPLES

Embodiments of the present invention and effects thereof will specifically be described by way of examples of the present invention and comparative examples. The present invention is not limited to the following examples.

Examples 1 to 11

Evaluation Substrate

A substrate for evaluation was formed as follows. In a silicon wafer, a hole having a diameter of 10 μm and a depth of 100 μm (L/D=10) was formed by a dry etching technology. On a side wall thereof, a silicon oxide film was formed as an insulating layer. Next, an adsorption layer was formed on the silicon oxide film by use of a coupling agent. Then, the resultant wafer was immersed in a palladium (Pd) colloidal solution, and thus a wafer having Pd, acting as a reaction start catalyst, attached thereto was formed.

Electroless Cobalt Plating Solution

An aqueous solution containing 2% by mass (0.13 mol/L) of cobalt sulfate, 6% by mass (0.32 mol/L) of citric acid as a complexing agent, 5% by mass (0.2 mol/L) of tungstate, and 0.4% by mass (0.07 mol/L) of dimethylamineborane as a reductant, and tetramethylammonium hydroxide as a pH adjusting agent was prepared. The pH value of the aqueous solution was adjusted to 9.5 by tetramethylammonium hydroxide contained as the pH adjusting agent.

Electroless Copper Plating Solution

An aqueous solution containing 0.5% by mass (0.03 mol/L) of copper sulfate, 4% by mass (0.14 mol/L) of ethylenediaminetetraacetic acid, 1% by mass (0.14 mol/L) of glyoxylic acid, 0.005% by mass (50 ppm) of 2,2'-bipyridyl, 0.05% by mass (500 ppm) of polyethyleneglycol, and tetramethylammonium hydroxide as a pH adjusting agent was prepared. The pH value of the aqueous solution was adjusted to 12.5 by tetramethylammonium hydroxide contained as the pH adjusting agent.

Process of Forming the Diffusion-Preventive Layer (Cobalt Alloy Film)

Figures 2A, 2B, 2C:
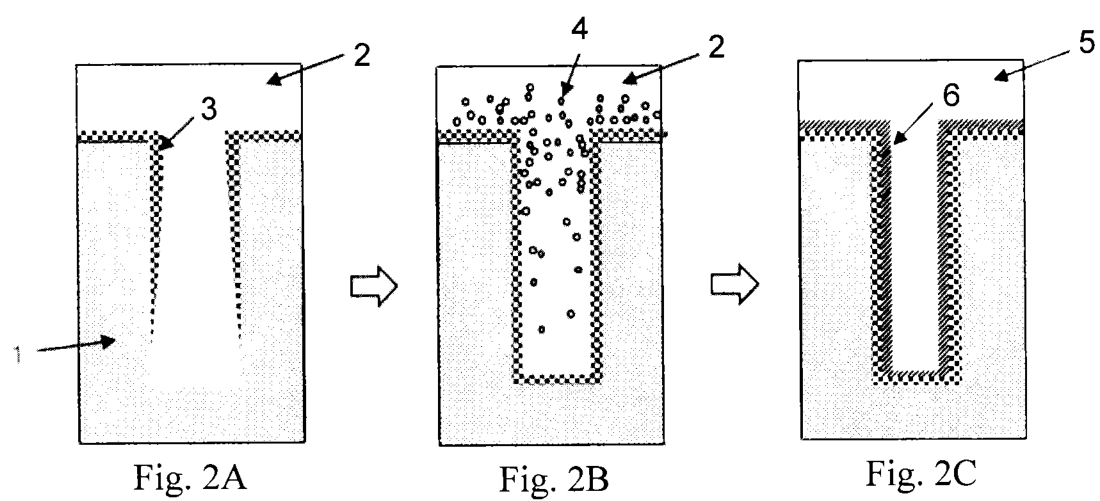
FIG. 2A is a schematic view showing that a diffusion-preventive layer is formed on a side wall of a through-hole formed in a substrate, more specifically, in an area extending from an entrance of the hole at which it is difficult to form the layer on the side wall to a central part of the hole, by use of an electroless plating solution.
FIG. 2B is a schematic view showing that a diffusion-preventive layer is formed in an area extending from the central part of the hole to a bottom of the hole by use of an electroless plating solution containing a polymer that contains an amino group.
FIG. 2C is a schematic view showing that a copper seed layer is formed on the diffusion-preventive layer by use of an electroless copper plating solution.

FIGS. 2A-2C provide schematic cross-sectional views showing steps of stacking a diffusion-preventive layer and a copper seed layer. An evaluation substrate 1 having a hole is immersed in an electroless cobalt plating solution (represented with reference sign 2 in FIG. 2A) at 60° C. for 10 minutes (first-stage process) to form a cobalt alloy film (diffusion-preventive layer) 3 in an area expanding from an entrance of the hole to a central part of the hole.

Next, an additive 4 (each of amino group-containing polymers shown in Table 1 below) was added to the electroless cobalt plating solution 2, and the substrate which has been subjected to the first-stage process was immersed in the resultant electroless cobalt plating solution 2 at 60° C. for 30 minutes (second-stage process; FIG. 2B) to form a cobalt alloy film (diffusion-preventive layer) 3 in an area expanding from the central part of the hole to the bottom of the film. The amino group-containing polymers used in these examples are all commercially available products of Nittobo Medical Co., Ltd.

Process of Stacking the Copper Seed Layer

The substrate which has been subjected to the second-stage process was immersed in an electroless copper plating solution 5 at 45° C. for 15 minutes to form a copper seed layer 6 (FIG. 2C) on the cobalt alloy film 3.

Measurement of the Thickness of the Cobalt Alloy Film

The evaluation substrate having the cobalt alloy film formed thereon was cut in a direction perpendicular to the hole, the cross-section of the cobalt alloy film was observed with a scanning electron microscope (SEM), and the thickness of the cobalt alloy film was measured. Thus, the thickness of the cobalt alloy film was found. The step coverage, which is the ratio of the thickness of the alloy film (diffusion-preventive layer) at the bottom of the hole with respect to the thickness of the alloy film (diffusion-preventive layer) at the entrance of the hole, namely, (S/C)×100%, was found by the following expression (1).

A step coverage of 30% to 300% was determined as "good".

Step coverage (%)={film thickness (nm) at the bottom of the hole}/{film thickness (nm) at the entrance of the hole}×100 (1)

Confirmation of the Formation of the Copper Seed Layer

The wafer having the copper seed layer stacked on the diffusion-preventive layer (cobalt alloy film) was cut in a direction perpendicular to the hole, and the state of the copper film formation and how much of the cobalt alloy film remained were observed with a scanning electron microscope.

Table 1 shows the thickness of the cobalt alloy film, the step coverage, whether or not the copper seed layer was grown, and whether or not the cobalt alloy film was extinct after the formation of the copper seed layer, in the case where polymers containing various types of amino groups were used as an additive to the electroless cobalt plating solution for the second-stage process.

TABLE 1

| | Additive | | | | | | | |
|---|---|---|---|---|---|---|---|---|
| | | Additive concentration | Additive concentration | Co alloy film thickness (nm) | | S/C | Cu grown | Co extinct |
| | Material name | (mg/kg) | (% by mass) | Entrance | Bottom | (%) | or not | or not |
| Example 1 | Polyallylamine | 2 | 0.0002 | 115 | 61 | 53 | Grown | Not extinct |
| Example 2 | Polyallylamine | 10 | 0.001 | 104 | 94 | 90 | Grown | Not extinct |

TABLE 1-continued

| | Additive | | | | | | | | |
|---|---|---|---|---|---|---|---|---|---|
| | | Additive concentration | Additive concentration | Co alloy film thickness (nm) | | S/C | Cu grown | Co extinct |
| | Material name | (mg/kg) | (% by mass) | Entrance | Bottom | (%) | or not | or not |
| Example 3 | Polyallylamine | 50 | 0.005 | 98 | 92 | 94 | Grown | Not extinct |
| Example 4 | Polydiallylamine | 3 | 0.0003 | 85 | 90 | 106 | Grown | Not extinct |
| Example 5 | Polydiallylamine | 10 | 0.001 | 95 | 91 | 96 | Grown | Not extinct |
| Example 6 | Polydiallylamine | 100 | 0.01 | 98 | 76 | 78 | Grown | Not extinct |
| Example 7 | Partially methoxycarbonylated polyallylamine | 10 | 0.001 | 102 | 93 | 91 | Grown | Not extinct |
| Example 8 | Partially methylcarbonylated polyallylamine | 10 | 0.001 | 120 | 87 | 73 | Grown | Not extinct |
| Example 9 | Poly(allylamine-co-dimethylallylamine) | 10 | 0.001 | 105 | 117 | 111 | Grown | Not extinct |
| Example 10 | Poly(diallylaminehydrochloride-co-sulfur dioxide) | 10 | 0.001 | 99 | 105 | 106 | Grown | Not extinct |
| Example 11 | Poly(methyldiallylamine) | 10 | 0.001 | 144 | 88 | 61 | Grown | Not extinct |

In each of Examples 1 to 11, the cobalt alloy film that was formed had a uniform thickness with a step coverage of 30% or higher and 300% or lower. The copper seed layer was formed without the cobalt alloy film being extinct.

Examples 12 and 13

The electrode plating was performed in substantially the same manner as in Example 1 except that an electroless nickel plating solution described below was used instead of the electroless cobalt plating solution.

Electroless Nickel Plating Solution

An aqueous solution containing 2% by mass (0.13 mol/L) of nickel sulfate, 4% by mass (0.21 mol/L) of citric acid as a complexing agent, 0.3% by mass (0.05 mol/L) of dimethylamineborane as a reductant, and tetramethylammonium hydroxide as a pH adjusting agent was prepared. The pH value of the aqueous solution was adjusted to 8.5 by tetramethylammonium hydroxide contained as the pH adjusting agent.

Measurement of the Thickness of the Nickel Alloy Film

The evaluation substrate having the nickel alloy film formed thereon was cut in a direction perpendicular to the hole, the cross-section of the nickel alloy film was observed with a scanning electron microscope (SEM), and the thickness of the nickel alloy film was measured. Thus, the thickness of the nickel alloy film was found.

The step coverage, which is the ratio of the thickness of the alloy film (diffusion-preventive layer) at the bottom of the hole with respect to the thickness of the alloy film (diffusion-preventive layer) at the entrance of the hole, namely, (S/C)×100%, was found by expression (1) shown above.

A step coverage of 30% to 300% was determined as "good".

Confirmation of the Formation of the Copper Seed Layer

The wafer having the copper seed layer stacked on the diffusion-preventive layer (nickel alloy film) was cut in a direction perpendicular to the hole, and the state of the copper film formation and how much of the nickel alloy film remained were observed with a scanning electron microscope.

Table 2 shows the results of the electroless plating in Examples 12 and 13, specifically, the thickness of the nickel alloy film, the step coverage, whether or not the copper seed layer was grown, and whether or not the nickel alloy film was extinct after the formation of the copper seed layer.

TABLE 2

| | Additive | | | | | | | |
|---|---|---|---|---|---|---|---|---|
| | | Additive concentration | Additive concentration | Ni alloy film thickness (nm) | | | Cu grown | Ni extinct |
| | Material name | (mg/kg) | (% by mass) | Entrance | Bottom | S/C (%) | or not | or not |
| Example 12 | Polyallylamine | 10 | 0.001 | 83 | 93 | 112 | Grown | Not extinct |
| Example 13 | Polydiallylamine | 10 | 0.001 | 82 | 79 | 96 | Grown | Not extinct |

In each of Examples 12 and 13, the nickel alloy film that was formed had a uniform thickness with a step coverage of 30% or higher. The copper seed layer was formed without the nickel alloy film being extinct.

Comparative Example 1

The electrode plating was performed in substantially the same manner as in Example 1 except that no additive (amino group-containing polymer) was added in the second-stage process performed by use of the electroless cobalt plating solution. Table 3 shows the results of the electroless plating.

TABLE 3

| | Additive | | | | | | | |
|---|---|---|---|---|---|---|---|---|
| | Material name | Additive concentration (mg/kg) | Additive concentration (% by mass) | Co alloy film thickness (nm) Entrance | Bottom | S/C (%) | Cu grown or not | Co extinct or not |
| Comparative example 1 | No additive | 0 (none) | 0 (none) | 497 | 78 | 16 | Grown | Not extinct |

In Comparative Example 1, the growth of the film formed at the entrance of the hole was not suppressed, and the cobalt alloy film that was formed had a non-uniform thickness with a step coverage lower than 30%.

Comparative Examples 2 to 7

The electrode plating was performed in substantially the same manner as in Example 1 except that an amine compound that was not an amino group-containing polymer was used as an additive in the second-stage process performed by use of the electroless cobalt plating solution. Table 4 shows the thickness of the cobalt alloy film, the step coverage, whether or not the copper seed layer was grown, and whether or not the cobalt alloy film was extinct after the formation of the copper seed layer, in the case where various types of amine compounds were used as an additive to the electroless cobalt plating solution.

TABLE 4

| | Additive | | | | | | | |
|---|---|---|---|---|---|---|---|---|
| | Material name | Additive concentration (mg/kg) | Additive concentration (% by mass) | Co alloy film thickness (nm) Entrance | Bottom | S/C (%) | Cu grown or not | Co extinct or not |
| Comparative example 2 | Triethylenetetramine | 10 | 0.001 | 450 | 66 | 15 | Grown | Not extinct |
| Comparative example 3 | 2-aminopyrimidine | 10 | 0.001 | 438 | 64 | 15 | Grown | Not extinct |
| Comparative example 4 | 3,5-dimethyl-1,2,4-tetrazole | 10 | 0.001 | 254 | 65 | 26 | Grown | Not extinct |
| Comparative example 5 | Hydroxylamine-o-sulfonic acid | 10 | 0.001 | 200 | 38 | 19 | Grown | Not extinct |
| Comparative example 6 | Pyrazole | 10 | 0.001 | 232 | 50 | 22 | Grown | Not extinct |
| Comparative example 7 | Poly(ethyltrimethylammonium methacrylate) | 10 | 0.001 | 397 | 60 | 15 | Grown | Not extinct |

In each of Comparative Examples 2 to 7, the growth of the film formed at the entrance of the hole was not suppressed, and the cobalt alloy film that was formed had a non-uniform thickness with a step coverage lower than 30%. The step coverage was not “good”.

Comparative Examples 8 to 10

The electrode plating was performed in substantially the same manner as in Example 1 except that sulfur-based compounds were used as an additive in the second-stage process performed by use of the electroless cobalt plating solution. Table 5 shows the thickness of the cobalt alloy film, the step coverage, whether or not the copper seed layer was grown, and whether or not the cobalt alloy film was extinct after the formation of the copper seed layer, in the case where the sulfur-based compounds were used as an additive to the electroless cobalt plating solution.

TABLE 5

| | Additive | | | | | | | |
|---|---|---|---|---|---|---|---|---|
| | Material name | Additive concentration (mg/kg) | Additive concentration (% by mass) | Co alloy film thickness (nm) Entrance | Bottom | S/C (%) | Cu grown or not | Co extinct or not |
| Comparative example 8 | 3,3'-dithiobis(1-propanesulfonic acid) | 10 | 0.001 | 89 | 97 | 109 | Grown | Extinct |
| Comparative example 9 | 1-allyl-3-(2-hydroxyethyl)-2-thiourea | 10 | 0.001 | 144 | 71 | 49 | Grown | Extinct |
| Comparative example 10 | Thiourea | 10 | 0.001 | 162 | 86 | 53 | Grown | Extinct |

In each of Comparative Examples 8 to 10, the electroless copper plating resulted in the growth of the copper plating film, but the cobalt alloy film was recognized to be extinct.

Comparative Example 11

Unlike in Example 1, only the first-stage process of the electroless cobalt plating was performed for forming a diffusion-preventive film. The evaluation substrate and the cobalt plating solution used were substantially the same as those of Example 1. Table 6 shows the measurement results of the film thickness.

TABLE 6

| | Additive | | | | | |
|---|---|---|---|---|---|---|
| | Material name | Additive concentration (mg/kg) | Additive concentration (% by mass) | Co alloy film thickness (nm) Entrance | Bottom | S/C (%) |
| Comparative example 11 | Only first-stage process (no additive) | None | None | 104 | 15 | 14 |

In Comparative Example 11, the film was not grown in the bottom part of the side wall of the hole. The cobalt alloy film that was formed had a non-uniform thickness with a step coverage lower than 30%.

Comparative Examples 12 and 13

Unlike in Example 1, only the second-stage process of the electroless cobalt plating was performed for forming a diffusion-preventive film. The evaluation substrate and the cobalt plating solution used were substantially the same as those of Example 1, and amino group-containing polymers as shown in Table 7 were added. Table 7 shows the measurement results of the film thickness.

TABLE 7

| | Additive | | | | | |
|---|---|---|---|---|---|---|
| | Material name | Additive concentration (mg/kg) | Additive concentration (% by mass) | Co alloy film thickness (nm) Entrance | Bottom | S/C (%) |
| Comparative example 12 | Only second-stage process (polyallylamine) | 10 | 0.001 | Not grown | 89 | — |
| Comparative example 13 | Only second-stage process (polydiallylamine) | 10 | 0.001 | Not grown | 93 | — |

In each of Comparative Examples 12 and 13, the film was not recognized to be grown at the entrance of the through-hole. No film was formed at the entrance of the side wall of the hole.

REFERENCE SIGNS LIST

A Diffusion-preventive layer formation step (first stage)
B Diffusion-preventive layer formation step (second stage)
C Copper seed layer stacking step
1 Evaluation substrate
2 Electroless cobalt plating solution or electroless nickel plating solution
3 Diffusion-preventive layer
4 Additive to the electroless plating solution
5 Electroless copper plating solution
6 Copper seed layer

The invention claimed is:

1. A method for forming a through-via, the method comprising:

(i) forming a first alloy film as a first diffusion-preventive layer that prevents diffusion of copper, in an area on a side wall of a hole formed in a substrate that extends from an entrance of the hole to a central part of the hole, by use of an electroless cobalt plating solution or an electroless nickel plating solution comprising at least cobalt ion or nickel ion, a complexing agent, a reductant, and a pH adjusting agent;

(ii) forming a second alloy film as a second diffusion-preventive layer in an area on the side wall of the hole formed in the substrate that extends from the central part of the hole to a bottom of the hole, by use of an electroless cobalt plating solution or an electroless nickel plating solution comprising at least the cobalt ion or the nickel ion, the complexing agent, the reductant, the pH adjusting agent, and an amino group-comprising polymer; and (iii) stacking a copper seed layer on the first diffusion-preventive layer and the second diffusion-preventive layer by use of an electroless copper plating solution, wherein the amino group-comprising polymer is an allylamine polymer, a diallylamine polymer, or a copolymer comprising allylamine or diallylamine.

2. The method according to claim 1, wherein an amount of the amino group-comprising polymer ranges from 0.0001% by mass to 0.02% by mass with respect to a total amount of the plating solution.

3. The method according to claim 2, wherein the plating solution used in each of said forming (i) and said forming (ii) comprises at least one of tungsten and molybdenum.

4. The method according claim 2, wherein a step coverage calculated as (S/C)×100% ranges from 30% to 300%, where S is a thickness of the second alloy film at the bottom of the hole and C is a thickness of the first alloy film at the entrance of the hole.

5. The method according to claim 1, wherein the plating solution used in each of said forming (i) and said forming (ii) comprises at least one of tungsten and molybdenum.

6. The method according claim 5, wherein a step coverage calculated as (S/C)×100% ranges from 30% to 300%, where S is a thickness of the second alloy film at the bottom of the hole and C is a thickness of the first alloy film at the entrance of the hole.

7. The method according to claim 1, wherein a step coverage calculated as (S/C)×100% ranges from 30% to 300%, where S is a thickness of the second alloy film at the bottom of the hole and C is a thickness of the first alloy film at the entrance of the hole.

8. The method according to claim 1, wherein the amino group-comprising polymer is an allylamine polymer.

9. The method according to claim 1, wherein the amino group-comprising polymer is a diallylamine polymer.

10. The method according to claim 1, wherein the amino group-comprising polymer is a copolymer comprising allylamine or diallylamine.

11. The method according to claim 1, wherein an amount of the amino group-comprising polymer ranges from 0.0002% by mass to 0.01% by mass with respect to a total amount of the plating solution.

* * * * *